United States Patent
Ueda et al.

(10) Patent No.: US 8,310,788 B2
(45) Date of Patent: Nov. 13, 2012

(54) PROTECTIVE FILM FORMING METHOD

(75) Inventors: Kunihiro Ueda, Hong Kong (CN);
Hong Xin Fang, Hong Kong (CN);
Dong Wang, Hong Kong (CN);
Yoshiyuki Konishi, Kyoto (JP); Satoko Ueno, Kyoto (JP); Shigenobu Okada, Kyoto (JP)

(73) Assignees: SAE Magnetics (H.K.) Ltd., Hong Kong (CN); Simadzu Corporation, Kyoto (JP)

( * ) Notice: Subject to any disclaimer, the term of this patent is extended or adjusted under 35 U.S.C. 154(b) by 1062 days.

(21) Appl. No.: 12/232,091

(22) Filed: Sep. 10, 2008

(65) Prior Publication Data
US 2009/0135521 A1 May 28, 2009

(30) Foreign Application Priority Data

Nov. 28, 2007 (CN) .................. 2007 1 0196399
Dec. 25, 2007 (JP) .................. 2007-331300

(51) Int. Cl.
*G11B 5/39* (2006.01)
(52) U.S. Cl. .................................... 360/235.4
(58) Field of Classification Search ............. 360/235.4
See application file for complete search history.

(56) References Cited

U.S. PATENT DOCUMENTS

| 5,609,948 | A * | 3/1997 | David et al. ............ 428/216 |
| 5,841,608 | A * | 11/1998 | Kasamatsu et al. ...... 360/236.6 |
| 6,246,538 | B1 * | 6/2001 | Kasamatsu et al. ...... 360/97.01 |
| 6,490,136 | B1 * | 12/2002 | Ito et al. ................. 360/236.4 |
| 6,985,315 | B2 * | 1/2006 | Yokohata et al. ........... 360/25 |
| 6,995,948 | B2 * | 2/2006 | Nakayama ................. 360/122 |
| 7,269,889 | B2 * | 9/2007 | Ueda et al. ............... 29/603.14 |
| 8,035,929 | B2 * | 10/2011 | Kawakita et al. ........... 360/315 |
| 2007/0163103 | A1 * | 7/2007 | Kagami et al. ............ 29/603.07 |

FOREIGN PATENT DOCUMENTS

| CN | 1691138 | 11/2005 |
| JP | 62-140225 | 6/1987 |
| JP | 2001-343227 | 12/2001 |
| JP | 2003-109339 | 4/2003 |

(Continued)

OTHER PUBLICATIONS

Office Action issued in corresponding Japanese Patent Application No. 2007-331300 on Sep. 6, 2011.

(Continued)

*Primary Examiner* — Mark Blouin
(74) *Attorney, Agent, or Firm* — Nixon & Vanderhye PC

(57) ABSTRACT

To provide a high-quality protection target by forming a protective film that is thin and excellent in corrosion resistance. Provided is a protective film forming method for forming a protective film at least on a surface of a protection target. The method comprises: a base film forming step for forming a base film on the surface of the protection target; and a DLC film forming step for forming a diamond-like carbon film on the base film. The base film forming step forms the base film on the surface of the protection target for a plurality of times by repeating a process of depositing the base film in a prescribed thickness and eliminating a part of or a whole part of the base film. Further, the method comprises, before the DLC film forming step, an insulating layer forming step for forming an insulating layer on the surface of the base film on which the diamond-like carbon film is to be formed.

24 Claims, 13 Drawing Sheets

FOREIGN PATENT DOCUMENTS

| | | |
|---|---|---|
| JP | 2003-208703 | 7/2003 |
| JP | 2005-259346 | 9/2005 |
| JP | 2005-302185 | 10/2005 |
| JP | 2006-107673 | 4/2006 |
| JP | 2007-026506 | 2/2007 |

OTHER PUBLICATIONS

Chinese Official Action issued for Chinese Patent Application No. 200710196399.5, dated Jul. 14, 2010 (with English Translation).

* cited by examiner

FIG. 10

| SAMPLES | FIRST BASE FILM (nm) | SECOND BASE FILM (nm) | FINAL FILM THICKNESS BASE FILM (nm) | FINAL FILM THICKNESS DLC (nm) | FINAL FILM THICKNESS TOTAL (nm) | PROCESSING STEPS (1) | (2) | (3) | (4) | (5) | (6) | (7) | (8) | REMARKS |
|---|---|---|---|---|---|---|---|---|---|---|---|---|---|---|
| 1 | 1 | — | 1 | 2 | 3 | ○ | ○ | | | | | ○ | | STD CONDITION 3nm |
| 2 | 3 | | 0.7 | 0.8 | 1.5 | ○ | ○ | ○ | | | | ○ | | 1.6 nm WITH ONE-TIME BASE ELIMINATION STEP |
| 3 | 3 | 3 | 1 | 0.8 | 1.8 | ○ | ○ | | | ○ | | ○ | | 1.8 nm WITH ONE-TIME BASE ELIMINATION STEP + NITRIDING TREATMENT |
| 4 | 0.5 | 3 | 0.7 | 0.8 | 1.5 | ○ | ○ | | | ○ | ○ | ○ | | 1.5 nm WITH ONE-TIME BASE ELIMINATION STEP + NITRIDING TREATMENT |
| 5 | 0.5 | 3 | 0.6 | 0.8 | 1.4 | ○ | ○ | | | ○ | ○ | ○ | | 1.4 nm WITH ONE-TIME BASE ELIMINATION STEP + NITRIDING TREATMENT |
| 6 | 3 | 3 | 1 | 0.8 | 1.8 | ○ | ○ | ○ | ○ | | ○ | ○ | | 1.8 nm WITH TWO-TIME BASE ELIMINATION STEP + NITRIDING TREATMENT |
| 7 | 3 | 3 | 0.7 | 0.8 | 1.5 | ○ | ○ | ○ | ○ | ○ | ○ | ○ | | 1.5 nm WITH TWO-TIME BASE ELIMINATION STEP + NITRIDING TREATMENT |
| 8 | 3 | 3 | 0.6 | 0.8 | 1.4 | ○ | ○ | ○ | ○ | ○ | ○ | ○ | | 1.4 nm WITH TWO-TIME BASE ELIMINATION STEP + NITRIDING TREATMENT |
| 9 | 3 | 3 | 1 | 0.8 | 1.8 | ○ | ○ | ○ | ○ | ○ | ○ | ○ | | 1.8 nm WITH TWO-TIME BASE ELIMINATION STEP + NITRIDING TREATMENT |
| 10 | 3 | 3 | 0.7 | 0.8 | 1.5 | ○ | ○ | ○ | ○ | ○ | ○ | ○ | | 1.5 nm WITH TWO-TIME BASE ELIMINATION STEP + NITRIDING TREATMENT |
| 11 | 3 | 3 | 0.6 | 0.8 | 1.4 | ○ | ○ | ○ | ○ | ○ | ○ | ○ | | 1.4 nm WITH TWO-TIME BASE ELIMINATION STEP + NITRIDING TREATMENT |
| 12 | 0.5 | | 0.5 | 1 | 1.5 | ○ | ○ | | | | | ○ | ○ | ETCHING ONLY ON DLC, FINAL FILM THICKNESS = 1.5 nm |
| 13 | 3 | 3 | 0.8 | 0.8 | 1.5 | ○ | ○ | ○ | ○ | ○ | ○ | ○ | | VOLTAGE WHEN ELIMINATING FIRST BASE LAYER = 150 V |
| 14 | 3 | 3 | 0.8 | 0.8 | 1.5 | ○ | ○ | ○ | ○ | ○ | ○ | ○ | | VOLTAGE WHEN ELIMINATING FIRST BASE LAYER = 100 V |
| 15 | 3 | 3 | 0.8 | 0.8 | 1.5 | ○ | ○ | ○ | ○ | ○ | ○ | ○ | | VOLTAGE WHEN ELIMINATING FIRST BASE LAYER = 50 V |
| 16 | 3 | 3 | 0.8 | 0.8 | 1.5 | ○ | ○ | ○ | ○ | ○ | ○ | ○ | | VOLTAGE WHEN ELIMINATING FIRST BASE LAYER = 25 V |

VOLTAGE WHEN ELIMINATING FIRST BASE LAYER = 200 eV

FIG. 11

| SAMPLES | HEAD NOISE | HOT-AND-HUMID | ACID DIPPING |
|---|---|---|---|
| 1 | 25% | 0% | 10% |
| 2 | 23% | 1% | 85% |
| 3 | 0.50% | 0.5% | 30% |
| 4 | 0.50% | 0.5% | 28% |
| 5 | 0.30% | 0.2% | 27% |
| 6 | 0.20% | 0.0% | 17% |
| 7 | 0.10% | 0.0% | 11% |
| 8 | 0.10% | 0.0% | 10% |
| 9 | 0.01% | 0.1% | 20% |
| 10 | 0.01% | 0.0% | 10% |
| 11 | 0.01% | 0.0% | 5% |
| 12 | 25% | 1.0% | 90% |
| 13 | 0.10% | 0.0% | 11% |
| 14 | 0.10% | 0.0% | 11% |
| 15 | 0.50% | 0.0% | 10% |
| 16 | 2.0% | 0.0% | 11% |

PROTECTIVE FILM FORMING METHOD

This application claims priority to Chinese Application No(s). 200710196399.5 filed 28Nov. 2007 and Japanese Application No. 2007-331300, filed 25 Dec. 2007, the entire contents of each of which are hereby incorporated by reference.

BACKGROUND OF THE INVENTION

1. Field of the Invention

The present invention relates to a protective film forming method and, more specifically, to a method for forming a thin protective film on a surface of a protection target.

2. Description of the Related Art

Recently, in order to implement size-reduction and large capacity, there has been a rapid advancement in increasing the recording density of magnetic disk devices. Accordingly, it is required to decrease distance between a magnetic head slider and a magnetic disk, i.e., to decrease floating amount of the magnetic head slider further with respect to the magnetic disk.

In the meantime, a decrease in the floating amount of the magnetic head slider with respect to the magnetic disk may increase a chance for the magnetic head slider to be in contact or to be collided with a magnetic head face that is being rotated at a high speed. Thus, it is necessary to form a protective film on a floating face of the magnetic head slider. Further, it is necessary for the protective film to have a high sliding characteristic (low friction characteristic) and abrasion resistance since it may come in contact with the magnetic disk face. Furthermore, for increasing the recording density, it is necessary to form a thickness of the protective film to be extremely thin in order to narrow the distance between a magnetic head element part and the magnetic disk. Moreover, the magnetic head element part comprises a magnetic recording element and a magnetoresistive element working as a reproducing element. Each of those elements is formed with a magnetic material that is easily corroded, so that the protective film is also required to have a function of preventing corrosion of the magnetic materials.

Now, a magnetic head slider protective film forming method employed conventionally will be described by referring to FIG. 1. As shown in a flowchart of FIG. 1, a protective film of a magnetic head slider is formed by going through a step of cleaning a surface of a protection target (magnetic head slider) in a bar block that includes a plurality of magnetic head sliders in a connected state (step S101), a step of forming a base film that contains silicon as a main component (step S102), and a step of forming a diamond-like carbon film (DLC) thereon (step S103). That is, the protective film of the magnetic head slider formed in this manner is constituted with a double-layered film that includes the base film made of a silicon film or a silicon oxide film, and the DLC film formed thereon.

Then, the magnetic head slider manufactured through the above-described steps is required to pass various kinds of corrosion tests so that the quality thereof can be maintained. Typical examples of the corrosion tests are an acid dipping test depicted in Patent Document 1 and a hot-and-humid test depicted in Patent Document 2.

Patent Document 1: Japanese Unexamined Patent Publication 2006-107673
Patent Document 2: Japanese Unexamined Patent Publication 2007-26506
Patent Document 3: Japanese Unexamined Patent Publication 2001-343227

However, when thickness of the protective film formed through the above-described steps, i.e., the protective film constituted with a double-layered film, is tried to be made thinner, it is difficult for such protective film to pass the corrosion tests mentioned above with the film thickness of less than 2 nm, for example. Therefore, the protective film of the above-described structure cannot be made thinner because of its corrosion resistance, so that it is not possible to achieve high recording density. Inversely, when the film of such protective film is thinned, the corrosion resistance is deteriorated. This results in deteriorating the quality of the magnetic head slider.

Further, as shown in FIG. 2, a protective film in a structure disclosed in Patent Document 2 is formed by going through a step of cleaning a surface of a protection target (magnetic head slider) (step S201), a step of forming a base film that contains silicon as a main component (step S202), a step of forming a diamond-like carbon film (DLC) thereon (step S203), and a step of thinning the thickness of the diamond-like carbon film by etching (step S204). Patent Document 2 discloses that this makes it possible for the protective film with the film thickness of less than 2 nm to pass the hot-and-humid test mentioned above. However, the protective film disclosed in Patent Document 2 is the double-layered film as in the case of Patent Document 1, so that it is difficult for this protective film to pass the acid dipping test that has more strict conditions. Therefore, it is still impossible with the protective film of Patent Document 2 to improve the corrosion resistance.

SUMMARY OF THE INVENTION

It is therefore an object of the present invention to improve the foregoing inconveniences and, in particular, to provide a high-quality protection target by forming a protective film that is thin and excellent in corrosion resistance.

Thus, a protective film forming method for forming a protective film at least on a part a surface of a protection target according to one aspect of the present invention employs a structure which comprises: a base film forming step for forming a base film on the surface of the protection target; and a DLC film forming step for forming a diamond-like carbon film on the base film, wherein the base film forming step forms the base film on the surface of the protection target for a plurality of times by repeating a process of depositing the base film in a prescribed thickness and eliminating a part of or a whole part of the base film.

Further, the present invention employs such a structure that the protective film forming method comprises, before the DLC film forming step, an insulating layer forming step for forming an insulating layer on a surface of the base film on which the diamond-like carbon film is to be formed.

Further, the protective film forming method employs such a structure that the base film forming step comprises: a first base film forming step for forming a first base film by depositing a base film in a prescribed thickness on the surface of the protection target and eliminating a part of or a whole part of the base film thereafter; and a second base film forming step for forming a second base film by depositing a base film further on the first base film and eliminating a part of the base film.

Specifically, the first base film forming step deposits a base film in a film thickness of 1 nm or more, and eliminates a part of the base film thereafter in such a manner that the base film comes to have less than 1 nm film thickness. Further, the second base film forming step deposits a base film in a film thickness of 1 nm or more, and eliminates a part of the base film thereafter in such a manner that the base film comes to have less than 1 nm film thickness.

With the present invention, first, the base film in a prescribed film thickness that can be materialized as a continuous film is deposited directly on the surface of the protection target. Thereafter, a part of or a whole part of the deposited base film is eliminated along the film-thickness direction so as to reduce the thickness of the film thereby to form the first base film. Then, a base film in thickness that is sufficient to be materialized as a continuous film is deposited thereon, and a part of the deposited base film is eliminated along the film-thickness direction so as to reduce the thickness of the film thereby to form the second base film. Note here that a base film formed by the above-described method which deposits a base film in a prescribed thickness and eliminates it thereafter may be deposited on the above-described base films further. Thereafter, the diamond-like carbon film is formed on the top layer. Thereby, the protective film can be formed. With this, it is possible to form the protective film that is thin but has suppressed film defect.

It is possible for the insulating characteristic of the film itself to be deteriorated, since the film thickness is made thinner. However, the insulating characteristic can be secured by forming the insulating layer on the surface of the base film on which the diamond-like carbon film is to be formed. With this, the protective film with an excellent corrosion resistance can be formed. Therefore, it is possible to improve the quality of the protection target on which the protective film is formed. Furthermore, it is possible to secure the electric characteristic by suppressing the AC noise and the like of the protection target.

Further, the protective film forming method employs such a structure that the base film forming step forms the base film by using one of silicon, silicon oxide, silicon nitride, and silicon carbide. Furthermore, the method employs such a structure that the base film forming step deposits the base film by sputtering, particularly by an ion beam sputtering method or a magnetron sputtering method.

Further, the protective film forming method employs such a structure that elimination of the base film performed in the base film forming step is executed by an oblique incident ion beam etching method which irradiates an ion beam by tilting it with respect to a film-thickness direction of the base film. Furthermore, the protective film forming method comprises, before the base film forming step, a surface cleaning step for cleaning the surface of the protection target, and the surface cleaning step is executed by performing an oblique incident ion beam etching method which irradiates an ion beam by tilting it with respect to a film-thickness direction of the base film. With this, the energy applied by the ion beam to the surface form which the base film is eliminated or the surface to be cleaned, i.e., the protection target itself, can be suppressed. Thus, damages that may be imposed upon the protection target can be lightened. By cleaning the surface, a natural oxide film on the surface of the protection target can be eliminated, so that the adhesion property of the base film formed thereon can be improved.

The protective film forming method employs such a structure that the base film forming step and/or the surface cleaning step is executed by the oblique incident ion beam etching method using a gas containing argon. Further, the insulating layer forming step forms the insulating layer by insulating the surface of the base layer on which the diamond-like carbon film is to be formed, by applying a plasma treatment. Note here that the insulating layer forming step performs the plasma treatment by using a mixed gas of argon and nitrogen or oxygen. Furthermore, the plasma treatment performed in the insulating layer forming step is executed by an electron cyclotron resonance plasma method or an oblique incident ion beam etching method. Moreover, the DLC film forming step forms the diamond-like carbon film by a Filtered Cathodic Vacuum Arc (FCVA) method.

Further, a protection target manufacturing method as another aspect of the present invention manufactures the protection target by forming the protective film at least on a part of the surface of the protection target by using the protective film forming method described above. The protection target manufacturing method is a magnetic head slider manufacturing method, for example, which forms a protective film on a floating face of the magnetic had slider as a protection target by using the above-described protective film forming method.

Further, another aspect of the present invention is a protection target that has the protective film formed thereon by the protective film forming method described above. The protection target has the protective film at least on a part of its surface. The protective film includes: a base film formed by repeating a process of depositing the base film in a prescribed thickness on the surface of the protection target and eliminating a part of or a whole part of the base film; and a diamond-like carbon film formed on the base film. Further, the protective film has an insulating layer obtained by insulating a surface of the base film on which the diamond-like carbon film is to be formed. The protection target is a magnetic head slider, for example.

Still another aspect of the present invention is a head gimbal assembly comprising the magnetic head slider, for example. Further, it can be applied to a hard disk drive that comprises the head gimbal assembly.

By employing the present invention for the protective film of the magnetic head slider to be loaded on the hard disk drive, the film thickness of the protective film can be formed extremely thin so as to narrow the distance between the magnetic head element part and the magnetic disk. This makes it possible to improve the corrosion resistance. Therefore, it is possible to achieve high recording density of the hard disk drive and to improve the reliability at the same time.

The present invention is structured and functions in the manner described above. With this, the protective film that is extremely thin and has a suppressed film defect can be formed. Therefore, the present invention can provide such an excellent effect that it is possible to form the protective film with an excellent corrosion resistance and to improve the quality of the protection target on which the protection film is formed, which has not been achieved conventionally.

BRIEF DESCRIPTION OF THE DRAWINGS

FIG. 10 is a table showing forming conditions of the protective films that are formed on magnetic head sliders used in experiments;

FIG. 11 is an illustration showing results of the experiments conducted on the magnetic head sliders that have the protective films formed thereon under each of the conditions shown in FIG. 10;

DETAILED DESCRIPTION OF THE PREFERRED EMBODIMENTS

A protective film forming method according to the present invention has a distinctive feature in its process for forming a base film that is a part of a protective film. Specifically, it is distinctive in respect that each layer, when forming a double-layered base film, is deposited once in a thickness to be thicker than a target thickness, and it is eliminated to a desired thickness thereafter. Further, it is also distinctive to provide an insulating layer between the base layer and a diamond-like carbon film, when forming the diamond-like carbon film on the base layer.

Hereinafter, the protective film forming method will be described in a concretive manner in a form of embodiments. The embodiments will be described by referring to a case of using a magnetic head slider as a target on which a protective film is formed. However, protection targets are not limited only to the magnetic head sliders. The protective film forming method of the present invention can be applied also when forming protective films on any kinds of articles such as other electronic components. Further, it is noted that all the articles (protection targets) that have the protective films formed by the method of the present invention are to be included within a scope of the present invention.

First Embodiment

Figure 3A:
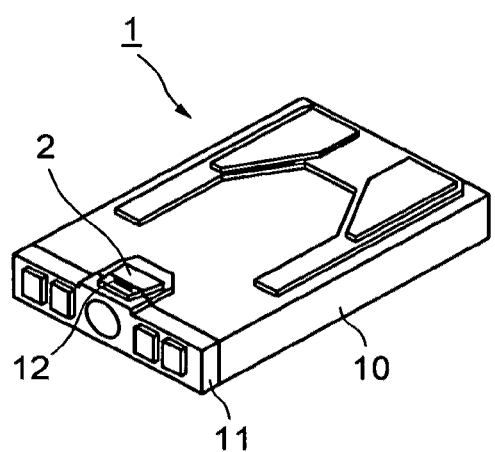
FIG. 3A is an illustration showing a magnetic head slider as a protection target and a protective film formed thereon.
Figure 3B:
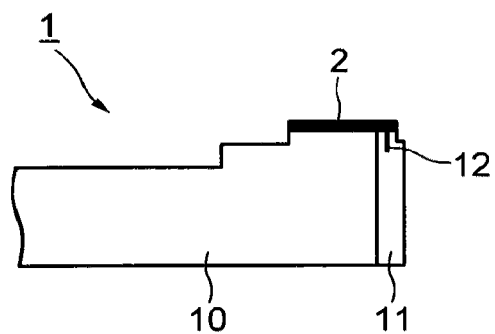
FIG. 3B is an illustration showing the magnetic head slider as the protection target and the protective film formed thereon.
Figure 4:
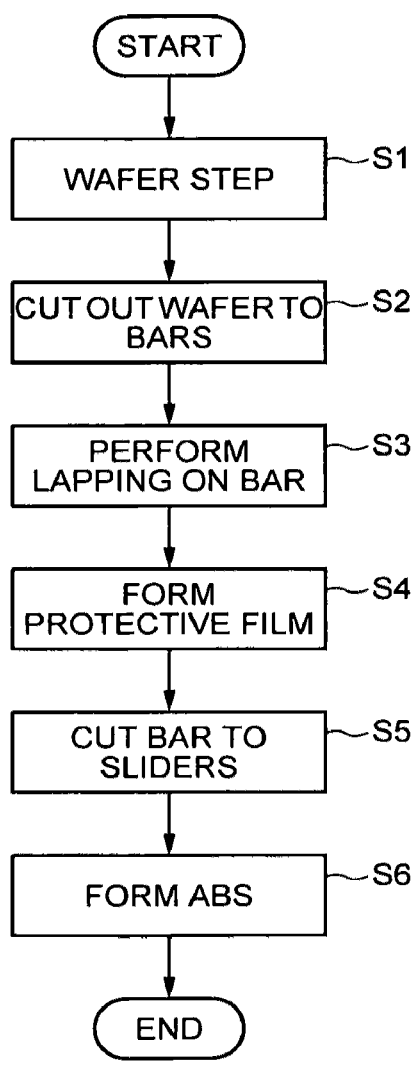
FIG. 4 is a flowchart showing a procedure for manufacturing the magnetic head slider.
Figure 5:
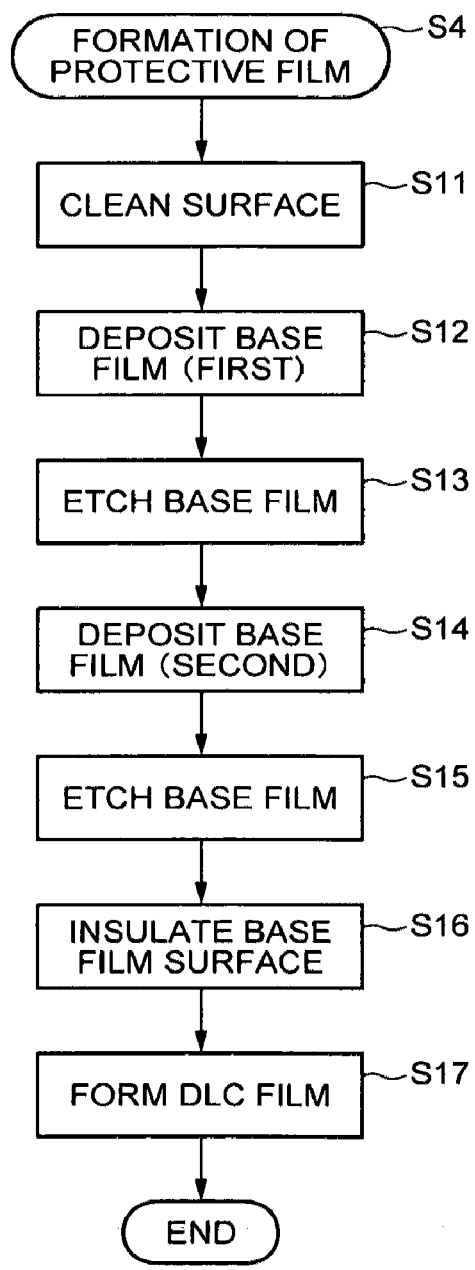
FIG. 5 is a flowchart showing a procedure for forming the protective film taken out from the procedure for manufacturing the magnetic head slider.
Figure 6A:
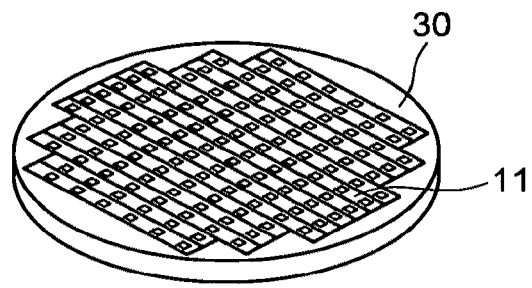
FIG. 6A is an illustration showing a manufacturing process of the magnetic head slider as a target for forming the protective film.
Figure 6B:
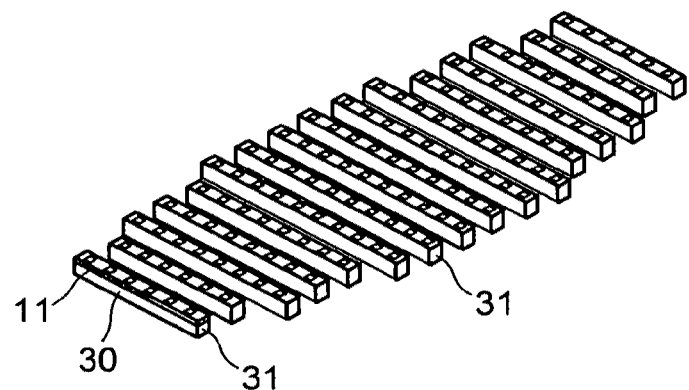
FIG. 6B is an illustration showing a manufacturing process of the magnetic head slider as the target for forming the protective film.
Figure 6C:
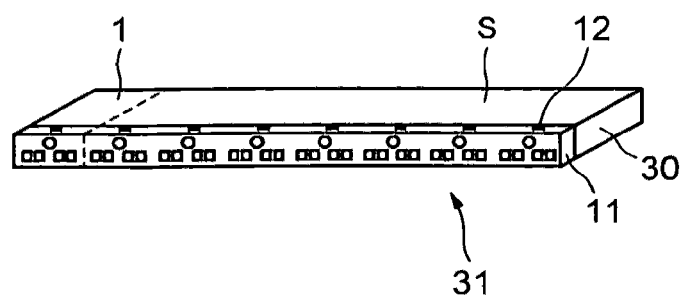
FIG. 6C shows the cutout bar block of FIG. 6B.

A first embodiment of the present invention will be described by referring to FIG. 3A-FIG. 11. FIG. 3A and FIG. 3B are illustrations showing a magnetic head slider as a protection target and a protective film formed thereon. FIG. 4 is a flowchart showing a procedure for manufacturing the magnetic head slider, and FIG. 5 is a flowchart showing a procedure for forming the protective film, which is a part of the procedure for forming the magnetic head slider. FIG. 6A-FIG. 6C are illustrations showing bar blocks having the connected magnetic head sliders as the targets for forming the protective films. FIG. 7A-FIG. 9B are illustrations showing each state when forming the protective film. FIG. 10 is a table showing forming conditions of the protective films, and FIG. 11 is an illustration showing results of experiments conducted on the magnetic head sliders that have the protective films formed thereon under each of the conditions.

The protection target in this embodiment is a magnetic head slider 1 shown in FIG. 3A. This magnetic head slider 1 comprises a magnetic head part 11 formed with a thin film at an end of a slider part 10. Further, as shown in FIG. 3B, a protective film 2 is formed to cover a part of a face to be a floating face of the magnetic head slider 1, especially a recording/reproducing element 12 part that is exposed from the magnetic head part 11. FIG. 3B is a schematic sectional view of the part of the magnetic head slider 1 where the recording/reproducing element 12 is formed.

In the magnetic head slider 1 shown in FIG. 3A and FIG. 3B, the protective film 2 is formed only in the periphery of the area where the recording/reproducing element 12 is formed. However, the protective film 2 may be formed in other areas as well. Further, it may be formed on the whole surface of the floating face (ABS). Hereinafter, a method for manufacturing the magnetic head slider 1 shown in FIG. 3A and FIG. 3B as well as a method for forming the protective film 2 on the magnetic head slider 1 will be described in details.

(Outline of Magnetic Head Slider Manufacturing Method)

First, the outline of the method for manufacturing the magnetic had slider 1 will be described by referring to FIG. 4. First of all, as shown in FIG. 6A, the magnetic head part 11 formed with a large number of thin film layers are deposited on a wafer 30 (base) that is made of a ceramics material, for example, through a thin-film forming step (a wafer step (step S1 of FIG. 4) using photolithography or the like. In this wafer step, a lamination material is deposited on the wafer 30 that is placed on a table, for example, by using a sputtering device or the like. Then, as necessary, resist, exposure, and development processing is performed on the deposited thin film, and the thin film layer is shaped into a desired form by an etching device or the like. Thereby, the magnetic head parts 11 are formed almost on the whole surface of the wafer 30, as shown in FIG. 6A.

Subsequently, the wafer 30 on which the magnetic head parts 11 shown in FIG. 6A are formed is cut out to obtain long and thin bar blocks 31 each having a plurality of connected magnetic head sliders 1 (step S2 of FIG. 4), as shown in FIG. 6B. The bar block 31 are cut out one by one with a cutter while holding the plurality of bar blocks 31 in a connected state with a jig from the top and bottom sides thereof and pulling them in the top and bottom directions. FIG. 6C shows the cutout bar block 31. The bar block 31 is cut out to individual magnetic head sliders 1 later, as shown with a dotted line in FIG. 6C.

Subsequently, the surface of the bar block 31, which is to be a floating face S of the magnetic head slider 1, is polished by a lapping device (a lapping step (step S3 of FIG. 4)). The length of the recording/reproducing element 12 exposed on the floating face S is adjusted by this lapping.

Then, the protective film 2 described above is formed on the lapped surface of the bar block 31, which is the floating face S of the magnetic head slider 1 (step S4 of FIG. 4). Here, the protective film 2 may be formed on the whole surface of the floating face S, or may be formed partially in advance. The method for forming the protective film 2 will be described later.

Thereafter, the bar block 31 is cut out into the individual magnetic head sliders 1 by a slider cutting device (step S5 of FIG. 4). This provides each piece of the magnetic head slider 1 in which the wafer 30 part becomes the slider part 12, and the magnetic head slider part 11 is provided at the end of the slider part 12. Then, an ABS of a prescribed shape is formed on the floating face S of each of the cutout magnetic head slider 1 (step S6 of FIG. 4), and prescribed processing such as cleaning is performed. Thereby, manufacture of the magnetic head sliders 1 is completed. The procedure described above is merely an example, and the magnetic head sliders 1 may be manufactured through other procedures and steps as well.

(Protective Film Forming Method)

Next, the method for forming the protective film shown as step S4 of FIG. 4 mentioned above will be described in details by referring to FIG. 5 and FIG. 7A-FIG. 9B. First, performed is processing (a surface cleaning step (step S11 of FIG. 5)) for cleaning a surface 13 of the bar block 31, which is to be the floating face S of the magnetic head slider 1, on which lapping is performed in step S3 of FIG. 4. This surface cleaning step is executed by an oblique incident ion beam etching method which irradiates an ion beam that is tilted from a direction that is vertical to the surface 13 of the bar block 31, for example. The ion beam etching is performed by using a gas having argon (Ar) as a main component as an inert gas used for generating ions.

With the irradiated ion beam, a natural oxide film on the surface 13 of the bar block 31 can be eliminated, thereby making it possible to strengthen the adhesion property of the base film (protective film) that is formed on the surface 13 later. Further, it is also possible to adjust the length of the recording element and reproducing element with the irradiated ion beam. Particularly, irradiated is not a vertical ion beam but a tilted ion beam with respect to the surface 13 of the bar block 31. Therefore, it is possible to suppress an energy applied to the bar block 31 by the ion beam. That is, it is more preferable to irradiate the ion beam by having it tilted from the vertical direction by a prescribed angle than irradiating it vertically to the surface 13 of the bar block 31. As a result, damages to the bar bock 31 to be the magnetic head sliders 1 generated by cleaning can be lightened, which results in suppressing deterioration of the quality thereof.

The gas used for the ion beam etching performed in the above-described surface cleaning step is not limited to the one having the component mentioned above. Further, the cleaning method is not limited to using the ion beam etching, but may employ any kinds of methods. However, it is desirable to employ a method that performs cleaning by irradiating a relatively low energy to the surface 13 of the bar block 31.

Subsequently, a base film having silicon as a main component, which is a part of the protective film 2, is formed on the cleaned surface 13 of the bar block 31 (a base film forming step). In the embodiment, in particular, two layers of base films are formed. For the material of the base films, silicon, silicon oxide, silicon nitride, or silicon carbide is used, for example. The base film forming step will be described in details hereinafter.

Figure 7A:
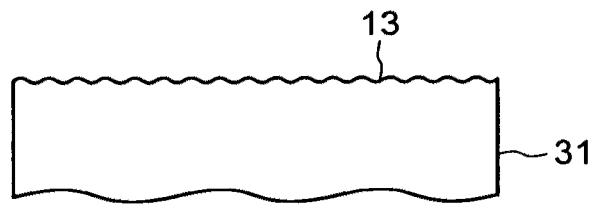
FIG. 7A is an illustration showing a state of forming the protective film on a surface of the magnetic head slider.
Figure 7B:
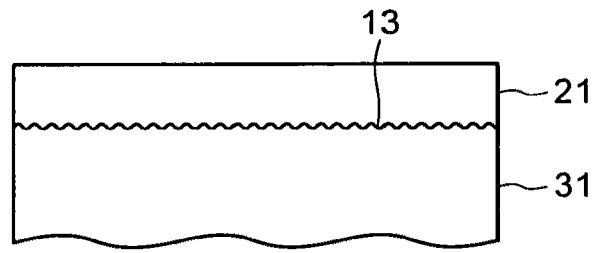
FIG. 7B is an illustration showing a state of forming the protective film on the surface of the magnetic head slider.

First, a first base film is formed on the surface 13 of the bar block 31 as in FIG. 7A (a first base film forming step (steps S12, S13 of FIG. 5). Specifically, as shown in FIG. 7B, a base film 21 in a prescribed thickness is formed on the surface 13 of the bar block 31 to be the magnetic head sliders 1 by using a sputtering method such as an ion beam sputtering method, a magnetron sputtering method, or the like. Here, it is so set that the thickness of the base film 21 to be deposited is 1 nm or more (for example, 3 nm). With this, the base film 21 as a continuous film that can be materialized as the film with fewer defects can be formed by the sputtering method (step S12 of FIG. 5).

Figure 7C:
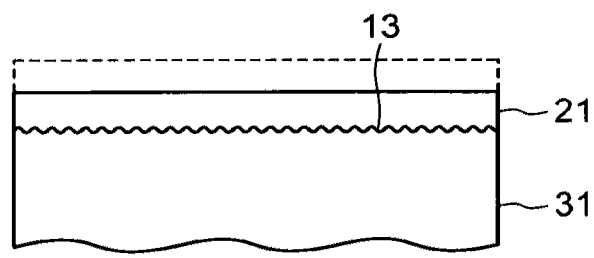
FIG. 7C is an illustration showing a state of forming the protective film on the surface of the magnetic head slider.
Figure 7D:
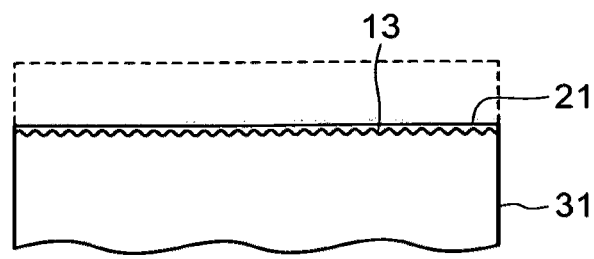
FIG. 7D is an illustration showing a state of forming the protective film on the surface of the magnetic head slider.

Thereafter, a part of or whole part of the base film 21 deposited in a thickness of 1 nm or more is eliminated to be in a thinner thickness (for example, less than 1 nm) as shown in FIG. 7C or FIG. 7D (step S13 of FIG. 5). Elimination of the deposited base film 21 is performed by the oblique incident ion beam etching method which irradiates an ion beam that is tilted with respect to a direction of the film thickness of the base film 21. The ion beam etching is performed by using a gas containing argon (Ar), such as an argon gas (containing 100% of argon) or a gas having argon as a main component.

Thereby, with the irradiated ion beam, it becomes possible to form an extremely thin first base film 21 by eliminating a part of the base film 21 that is once deposited relatively thicker.

In the above-described elimination processing, irradiated is not the vertical ion beam with respect to the surface 13 of the bar block 31 but the ion beam that is tilted with respect to the direction of the film thickness, as in the case of the cleaning step described above. Thus, it is possible to suppress the energy applied by the ion beam to the bar block 31 itself. As a result, damages that may be imposed upon the bar block 31, i.e., on the magnetic head sliders 1, can be lightened, thereby making it possible to suppress deterioration of the quality thereof.

At the time of eliminating the base film, it is etched to a prescribed thickness, while measuring the film thickness through a measurement method by ESCA that is disclosed in Patent Document 3, which measures composition and linkage state of the chemical elements on a substance surface. For example, when found by the ESCA measurement that amount of silicon has reached a specific value or less, it is judged that a desired amount of base film has been removed. Upon this, the elimination processing is stopped.

Figure 8A:
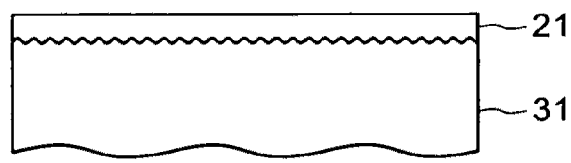
FIG. 8A is an illustration showing a state of forming the protective film on the surface of the magnetic head slider.
Figure 8B:
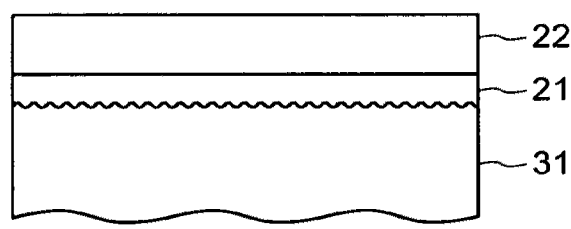
FIG. 8B is an illustration showing a state of forming the protective film on the surface of the magnetic head slider.

Subsequently, as shown in FIG. 8A, a second base film 22 is formed further on the first base film 21 that is formed on the surface 13 of the bar block 31 (a second base film forming step (steps S14, S15 of FIG. 15). Specifically, as shown in FIG. 8B, the base film 22 in a prescribed thickness is formed on the first base film 21 that is formed on the surface 13 of the bar block 31 by using a sputtering method such as an ion beam sputtering method, a magnetron sputtering method, or the like. Here, it is so set that the film thickness of the base film 22 to be deposited is 1 nm or more (for example, 3 nm). With this, the base film 22 as a continuous film that can be materialized as the film with fewer defects can be formed by the sputtering method (step S14 of FIG. 5). As in the above, silicon, silicon oxide, silicon nitride, or silicon carbide is used, for example, for the material of the base film.

Figure 8C:
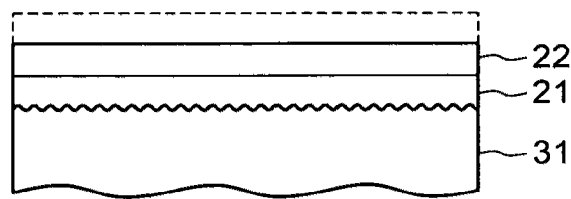
FIG. 8C is an illustration showing a state of forming the protective film on the surface of the magnetic head slider.

Thereafter, a part of the base film 22 deposited in a thickness of 1 nm or more is eliminated to be in a thinner thickness (for example, less than 1 nm) as shown in FIG. 8C (step S15 of FIG. 5). For example, elimination is performed in such a manner that the thickness of the first base film 21 and the second base film 22 becomes 0.8 nm in total. Here, elimination of a part of the deposited base film 22 is performed by the oblique incident ion beam etching method which irradiates an ion beam that is tilted with respect to a direction of the film thickness of the base film 22. The ion beam etching is performed by using a gas containing argon (Ar), such as an argon gas (containing 100% of argon) or a gas having argon (Ar) as a main component.

Thereby, with the irradiated ion beam, it becomes possible to form an extremely thin second base film 22 by eliminating a part of the base film 22 that is once deposited relatively thicker. This method makes it possible to form a protective film that is extremely thin and has fewer defects.

In the elimination processing performed at the time of forming the second base film 22, irradiated is the ion beam that is tilted with respect to the direction of the film thickness, as in the case of forming the first base film 21 described above. Thus, it is possible to suppress the energy applied by the ion beam to the bar block 31 itself. As a result, damages that may be imposed upon the bar block 31, i.e., on the magnetic head sliders 1, can be lightened, thereby making it possible to suppress deterioration of the quality thereof. Further, as described above, at the time of eliminating the base film, the film thickness thereof is adjusted to a desired thickness, while measuring the film thickness through a measurement method by ESCA that is disclosed in Patent Document 3, which measures composition and linkage state of the chemical elements on a substance surface.

Subsequently, processing for forming an insulating layer on the second base film 22 is performed (an insulating layer forming step (step S16 of FIG. 5)). Note here that the insulating characteristic of the film itself may become deteriorated because the thicknesses of the base films 21 and 22 are thin as described above. That is, since "resistance=resistivity×thickness", when the thickness becomes thinner, the resistance becomes smaller. Thereby, the film comes to have an electric current flown therethrough. The insulating layer is formed to deal with such inconvenience. Specifically, a plasma treatment executed by using a mixed gas of argon and nitride or oxygen is applied on the surface of the second base film 22. This nitrides or oxidizes the surface of the second base film 22, thereby reforming it to an insulating film 22a as show in FIG. 9A. It is desirable to perform the plasma treatment by the oblique incident ion beam etching or an electron cyclotron resonance plasma method (ECR plasma method). With this, the damages to the bar block 31 can be reduced as in the above case by the use of the low energy method. Here, since the second base film 22 is eliminated slightly by the plasma treatment, it is possible to obtain a still thinner film while achieving the insulating characteristic described above. However, the method for insulating the surface of the second base film 22 is not limited to the method described above. Further, an insulating layer may be formed by providing another insulating material on the surface of the second base film 22, without insulating the second base film 22 itself.

As described above, by forming the insulating film 22a, it is possible to secure the insulating characteristic of the protective film 2. Thus, the corrosion resistance can be improved. Further, the protective film 2 keeps the characteristic of silicon or carbon as it is, so that a head noise component called an AC noise is to remain especially in a TMR head. The AC noise is peculiar to TMR, which is induced by a local short-circuit of a sensor part. In order to shut off the short-circuit, it is desirable to use an insulating composition. Thus, it is desirable to nitride or oxide Si as described above, in order to secure the insulating characteristic without specifically changing the composition by a great amount. Therefore, as described above, it becomes possible to improve the corrosion resistance and also to lighten the AC noise and the like so as to secure an electric characteristic through insulating the surface of the base film 22 that has silicon as the main component.

Further, through providing the insulating characteristic, it becomes possible to control an internal stress of the film, which is important for thinning the film. That is, while the base film having silicon as the main component is used for improving the adhesion property of the carbon film, it also provides the effect of achieving stress control at the same time. Specifically, with a deposited layer having a sharp internal stress, the adhesion property is overwhelmed by the internal stress, thereby causing exfoliation. Thus, it is necessary to change the internal stress successively. Through providing the insulating characteristic as described above, it becomes possible to control the internal stress gradually.

Figure 9A:
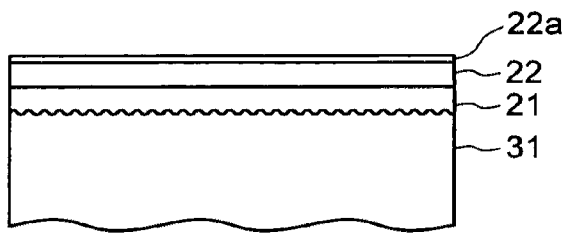
FIG. 9A is an illustration showing a state of forming the protective film on the surface of the magnetic head slider.
Figure 9B:
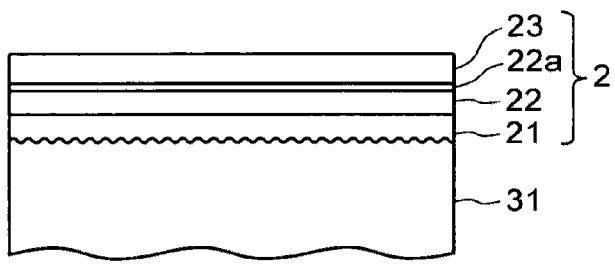
FIG. 9B is an illustration showing a state of forming the protective film on the surface of the magnetic head slider.

Subsequently, a diamond-like carbon film 23 is formed on the above-described base films 22 and 23, i.e., on the insulating film 22a formed on the surface of the second base film 22, as shown in FIG. 9B (a DLC forming step (step S17 of FIG. 5)). For example, the diamond-like carbon film 23 is formed by Filtered Cathodic Vacuum Arc (FCVA) method, for example. It is found by the above-described ESCA measurement that SiC is formed by a reaction of the carbon film and the base film when forming the DLC film. In this step, a target value of the thickness of the diamond-like carbon film 23 to be formed is 0.8 nm.

In the manner described above, the protective film 2 is formed with the first base film 21, the second base film 22 and 22a with the insulated surface, and the DLC film 23. The protective film 2 is formed as a low-defect continuous film by repeatedly depositing and eliminating the first base film 21 and the second base film 22. Further, the surface of the second base film 22 is insulated by applying a plasma treatment. With the structure described above, it is possible to secure the electric characteristic by reducing the AC noise and the like, while improving the corrosion resistance of the magnetic head slider 1 that is protected by the protective film 2.

(Corrosion Resistance Experiment)

Next, there were manufactured the magnetic head sliders (samples) on which respective protective films 2 were formed under various conditions (processing steps), and corrosion tests of each sample were conducted. The results thereof will be described by referring to FIG. 10-FIG. 11.

First, all the samples 1-16 were the magnetic head sliders 1 in a same structure, and the manufacturing steps of the magnetic head sliders 1 were almost the same. However, methods for forming the respective protective films 2, i.e., the processing steps thereof, were different from each other as shown in FIG. 10. Corrosion tests such as a hot-and-humid test and an acid dipping test were conducted on each of the samples 1-16 manufactured under each condition. Further, in each of the processing steps, bar blocks for the corrosion tests and the bar blocks for the film-thickness measurement were formed simultaneously. For the bar blocks for the film-thickness measurement, thicknesses of each film constituting the protective films 2 were calculated by the ESCA measurement method described above. For measuring the film thickness, the bar blocks for film-thickness measurement in almost the same shape as that of the bar blocks for the corrosion tests were measured directly, so that errors were extremely small. Further, the measured values obtained by the ESCA measurement method have already been calibrated by a transmission electron microscope (TEM).

The processing steps for forming the protective film are as follows.

(1) Perform cleaning on the surface of the bar block by the oblique incident ion beam etching (IBE) method using an argon (Ar) gas (2) Deposit a silicon base film by the sputtering method (3) Eliminate the base film by the oblique incident IBE method using the Ar gas (4) Deposit a silicon base film again by the sputtering method (5) Eliminate the base film (adjust to a desired film thickness) by the oblique incident IBE method using the Ar gas
(6) Nitride the surface of the base film with a nitriding plasma treatment by the oblique incident IBE method using a mixed gas of Ar and nitrogen ($N_2$) (this provides a surface eliminating effect to some extent, so that the film thickness becomes thinner by about 0.2 nm)
(7) Deposit a diamond-like carbon film (DLC) thereon by FCVA method (a DLC film formed by the FCVA method is also called a tetrahedral amorphous carbon (taC) film)
(8) Etch the DLC film (only the sample 12)

For the oblique incident IBE method used in the steps (1), (3), and (5) described above, the ion energy was set as 150 V, and the tilt angle was set as 65 degrees for not damaging the bar blocks. As an experiment, the angle of the ion beam with respect to the surface 13 of the bar block was set as 0 degree, i.e., set to be vertical. With that angle, obtained was a clearly bad result. Further, in the nitriding treatment by the oblique incident IBE method used in the step (6), the ion energy was set as 50 V, and the tilt angles was set as 65 degrees to suppress the energy to be low in order to restrain the surface elimination effect to be about 0.2 nm.

Figure 1:
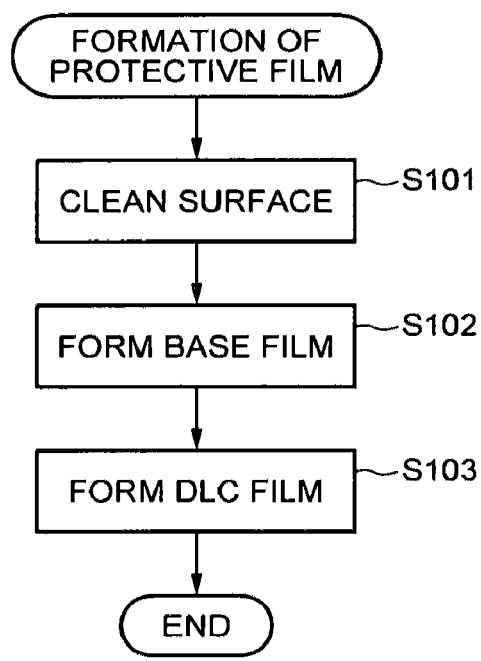
FIG. 1 is a flowchart showing a procedure for forming a conventional protective film.
Figure 2:
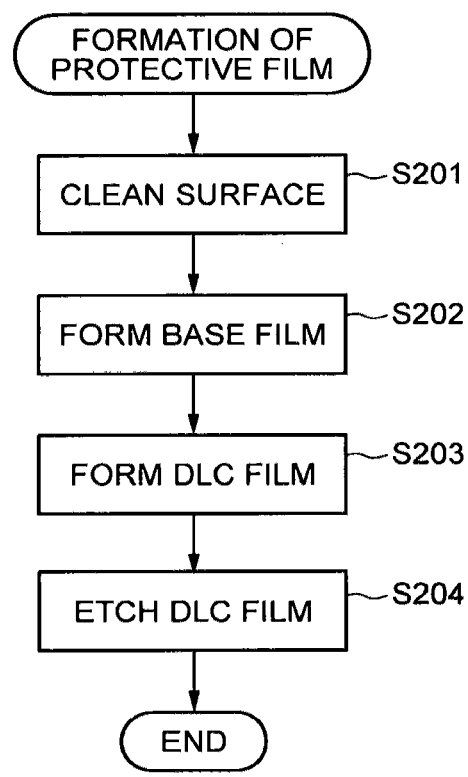
FIG. 2 is a flowchart showing a procedure for forming a conventional protective film.

The magnetic head slider samples 1-16 having the various protective films, i.e., the above-described protective films, were formed by combining each of the above-described steps (1)-(8) and by changing the film-thicknesses of the base films and the DLC film. The magnetic head sliders according to the present invention described above are the samples 6-11 and 13-16. That is, those samples were obtained by forming two layers of the base films, insulating the surface, and forming the DLC film further. In the meantime, the samples 1 and 2 were obtained by forming the protective films by a conventional method that is shown mainly in FIG. 2, and the samples 3-5 were obtained by applying an insulating treatment on the samples 1, 2. Further, the sample 12 was obtained by forming a protective film by a method that is disclosed in Patent Document 2 described by referring to FIG. 2. That is, the samples 1-5, and 12 were constituted with only a single layer without forming two layers of the base films in the manner described above.

The acid dipping test as the corrosion test conducted on each sample was executed through dipping the bar blocks with the protective film in an oxalic acid solution (0.25 N) for four minutes and counting the number of corroded sliders. The number of corroded slider was divided by the number of dipped sliders to show the corrosion rate in percentages. An optical microscope of 1500 magnifications was used to observe the sliders to judge whether or not the sliders were corroded. Further, two bars were used to have a hundred (50×2=100) sliders as the sample base number. For the hot-and-humid test, the bars were kept in an atmosphere at 85 degrees Celsius and with 85% RH for a hundred hours. Then, QST measurement was conducted before and after to find what percentages of sliders with 5% or more of MRR change rate were generated. Further, for the head noise to be measured, noise components to be overlapped with a main waveform were swept successively as "0" Oe→"+300" Oe "0" Oe→"31 300" Oe, and noise peaks of 1.2% or higher were counted when "+300" Oe and "−300" Oe were applied. Then, the number of sliders that had one-hundred fifty or more noise peaks of 1.2% or higher in a single slider was counted, and values obtained by dividing that number by the whole number of measured sliders were shown in percentages.

As shown in FIG. 11, first, low numerical values were Obtained for all the samples with the hot-and-humid test. Further, low numerical values were obtained for the head noise except for the samples 1, 2, and 12. Regarding the acid dipping test, numerical values equal to or lower than 20% were obtained with the samples 6-11 and 13-16. Those samples except for the sample 1 had the final film thickness of 2 nm or less as shown in FIG. 10.

As has been described above, the protective film 2 according to the embodiment is constituted with two layers of base films (first base film 21 and second base film 22) formed by once depositing a film relatively thicker, and eliminating a part thereof. Thereby, a low-defect continuous film can be obtained. Therefore, the corrosion resistance can be improved. Further, by insulating the surface of the second base film 22 with a plasma treatment, it is also possible to secure the electric characteristic by lightening the AC noise and the like, while improving the corrosion resistance further. As a result, it becomes possible to improve the quality and reliability of the protection targets such as the magnetic head sliders that are protected by the protective film 2.

As a result of the ESCA measurement, the peak position of N1s was in 397.5-398 eV, and the peak position of Si2p was in 101.5-102 eV. It is known according to Patent Document 3 that Si2p is 101.6 eV when N1s is 397.5 eV. Thus, it is considered a proof that a nitride film is fabricated on the surface of the second base film 22 through the above-described steps.

Second Embodiment

Figure 12:
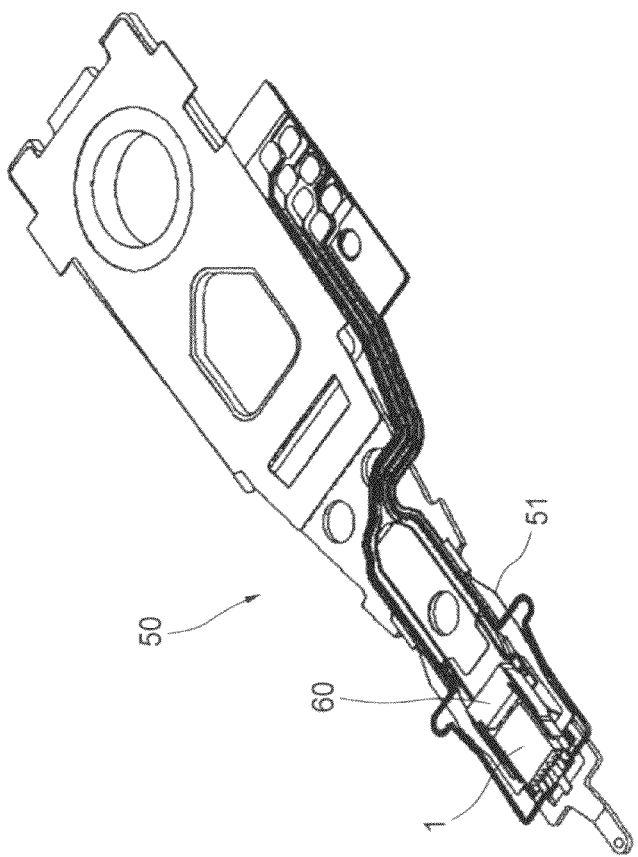
FIG. 12 is an illustration showing a structure of a head gimbal assembly to which the magnetic head slider having the protective film formed thereon is loaded.

Next, a second embodiment of the present invention will be described by referring to FIG. 12-FIG. 13. FIG. 12 is an illustration showing a head gimbal assembly 50 on which the magnetic head slider 1 having the protective film 2 formed thereon by the protective film forming method described in the first embodiment is loaded. As shown in the illustration, the magnetic head slider 1 is loaded on the head gimbal assembly 50 by being mounted on a tongue face of a flexure 51, while being held to a micro actuator 60 that is loaded on the tongue face, for example. The head gimbal assembly 50 may be structured to have the magnetic head slider 1 loaded directly on the tongue face without having the micro actuator 60.

Figure 13:
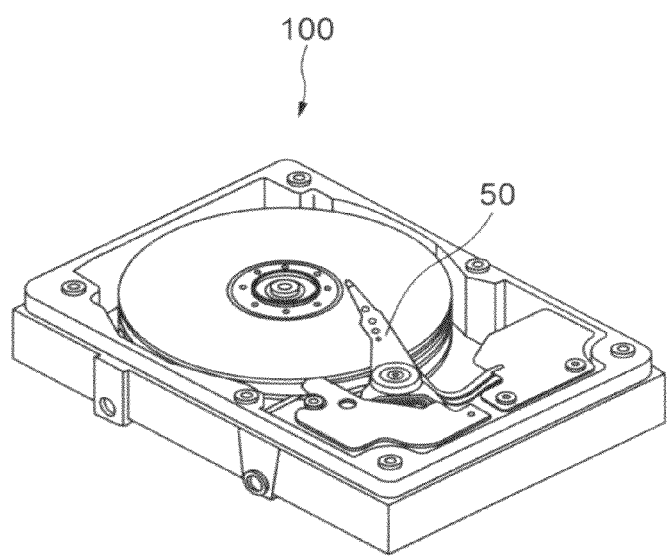
FIG. 13 is an illustration showing a hard disk drive to which the magnetic head slider having the protective film formed thereon is loaded.

Further, FIG. 13 is an illustration showing a structure of a hard disk drive 100 on which the above-described head gimbal assembly 50 is loaded. The hard disk drive 100 comprises a plurality of disks, and comprises the head gimbal assemblies 50 by corresponding to each disk. That is, the hard disk drive 100 comprises a head stack assembly that has a plurality of head gimbal assemblies 50 in such a manner that the above-described magnetic head sliders 1 are arranged to face the disk faces of each disk.

Through constituting the head gimbal assembly 50 having the magnetic head slider 1 disclosed in the first embodiment and also constituting the hard disk drive 100 in the manner described above, it becomes possible to increase the storage capacity of the hard disk drive 100 and to improve the reliability.

The protective film forming method according to the present invention can be utilized when forming a protective film on the surfaces of electronic components and the like, such as the magnetic head sliders. Therefore, the protective film forming method according to the present invention has an industrial applicability.

What is claimed is:
1. A protective film forming method for forming a protective film including a base film and a diamond-like carbon (DLC) film at least on a part of a surface of a protection target, said method comprising:
   forming said base film on said surface of said protection target; and forming said diamond-like carbon film on said base film, wherein said forming of said base film forms said base film on said surface of said protection target for a plurality of times by repeating a process of depositing said base film in a prescribed thickness and eliminating a part of or a whole part of said base film, and said forming of said DLC film forms said diamond-like carbon film on said base film which is formed for a plurality of times on said surface of said protection target.

2. The protective film forming method according to claim 1, further comprising, before said forming of said DLC film forming an insulating layer on a surface of said base film on which said diamond-like carbon film is to be formed.

3. The protective film forming method according to claim 1, wherein said forming of said base film forming comprises:

forming a first base film by depositing a base film in a prescribed thickness on said surface of said protection target and eliminating a part of or a whole part of said base film thereafter; and forming a second base film by depositing a base film further on said first base film and eliminating a part of said base film.

4. The protective film forming method according to claim 3, wherein said forming of said first base film deposits said base film in a film thickness of 1 nm or more, and eliminates a part of said base film thereafter in such a manner that said base film comes to have less than 1 nm film thickness.

5. The protective film forming method according to claim 4, wherein said forming of said second base film deposits said base film in a film thickness of 1 nm or more, and eliminates a part of said base film thereafter in such a manner that said base film comes to have less than 1 nm film thickness.

6. The protective film forming method according to claim 1, wherein said forming of said base film forms said base film by using one of silicon, silicon oxide, silicon nitride, and silicon carbide.

7. The protective film forming method according to claim 1, wherein elimination of said base film performed in said base film forming is executed by an oblique incident ion beam etching method which irradiates an ion beam by tilting it with respect to a film-thickness direction of said base film.

8. The protective film forming method according to claim 1, comprising, before said forming of said base film, cleaning said surface of said protection target, wherein said surface cleaning is executed by performing an oblique incident ion beam etching method which irradiates an ion beam by tilting it with respect to a film-thickness direction of said base film.

9. The protective film forming method according to claim 7, wherein said forming of said base film forming is executed by said oblique incident ion beam etching method using a gas containing argon.

10. The protective film forming method according to claim 8, wherein said surface cleaning is executed by said oblique incident ion beam etching method using a gas containing argon.

11. The protective film forming method according to claim 2, wherein said forming of said insulating layer forms said insulating layer by insulating said surface of said base layer on which said diamond-like carbon film is to be formed, by applying a plasma treatment.

12. The protective film forming method according to claim 11, wherein said forming of said insulating layer performs said plasma treatment by using a mixed gas of argon and nitrogen or oxygen.

13. The protective film forming method according to claim 12, wherein said plasma treatment performed in said forming of said insulating layer is executed by an electron cyclotron resonance plasma method or an oblique incident ion beam etching method.

14. The protective film forming method according to claim 1, wherein said forming of said DLC film forms said diamond-like carbon film by a Filtered Cathodic Vacuum Arc (FCVA) method.

15. A manufacturing method of a protection target for manufacturing said protection target by forming said protective film at least on a part of said surface of said protection target by using said protective film forming method of claim 1.

16. A protection target, having said protective film formed thereon by said protective film forming method of claim 1.

17. A magnetic head slider manufacturing method for manufacturing a magnetic head slider as said protection target by forming said protective film on a floating face of said magnetic head slider by using said protective film forming method of claim 1.

18. A magnetic head slider, having said protective film formed thereon by said protective film forming method of claim 1.

19. A protection target, having a protective film at least on a part of its surface, wherein said protective film includes: a base film formed by repeating a process of depositing said base film in a prescribed thickness on said surface of said protection target and eliminating a part of or a whole part of said base film; and a diamond-like carbon film formed on said base film.

20. The protection target according to claim 19, wherein said protective film has an insulating layer obtained by insulating a surface of said base film on which said diamond-like carbon film is to be formed.

21. A magnetic head slider, having a protective film at least on a part of its floating face, wherein said protective film includes: a base film formed by repeating a process of depositing said base film in a prescribed thickness on said surface of said protection target and eliminating a part of or a whole part of said base film; and a diamond-like carbon film formed on said base film.

22. The magnetic head slider according to claim 21, wherein said protective film has an insulating layer obtained by insulating a surface of said base film on which said diamond-like carbon film is to be formed.

23. A head gimbal assembly, comprising said magnetic head slider of claim 21.

24. A hard disk drive, comprising said head gimbal assembly of claim 23.

* * * * *